(12) United States Patent
Nakai

(10) Patent No.: US 7,409,606 B2
(45) Date of Patent: Aug. 5, 2008

(54) METHOD AND SYSTEM FOR INTERLEAVING IN A PARALLEL TURBO DECODER

(75) Inventor: Noriyuki Nakai, Midori-ku (JP)

(73) Assignee: Motorola, Inc., Schaumburg, IL (US)

( * ) Notice: Subject to any disclaimer, the term of this patent is extended or adjusted under 35 U.S.C. 154(b) by 546 days.

(21) Appl. No.: 11/216,867

(22) Filed: Aug. 31, 2005

(65) Prior Publication Data

US 2007/0061666 A1    Mar. 15, 2007

(51) Int. Cl.
*H03M 13/27* (2006.01)
(52) U.S. Cl. .................................................. 714/701
(58) Field of Classification Search ................... 714/701
See application file for complete search history.

(56) References Cited

U.S. PATENT DOCUMENTS

| | | | |
|---|---|---|---|
| 6,381,728 B1 * | 4/2002 | Kang | 714/781 |
| 6,427,214 B1 * | 7/2002 | Li et al. | 714/701 |
| 6,603,412 B2 * | 8/2003 | Gatherer et al. | 341/61 |
| 6,678,843 B2 * | 1/2004 | Giulietti et al. | 714/701 |
| 6,697,990 B2 * | 2/2004 | El-Gamal et al. | 714/755 |
| 6,775,800 B2 * | 8/2004 | Edmonston et al. | 714/755 |
| 6,901,492 B2 * | 5/2005 | Berens et al. | 711/157 |
| 6,973,611 B2 * | 12/2005 | Dabak et al. | 714/755 |
| 7,302,621 B2 * | 11/2007 | Edmonston et al. | 714/702 |
| 2003/0014700 A1 * | 1/2003 | Giulietti et al. | 714/701 |
| 2003/0028843 A1 | 2/2003 | Chang et al. | |
| 2004/0044946 A1 | 3/2004 | Bickerstaff et al. | |
| 2004/0052144 A1 | 3/2004 | Bickerstaff et al. | |

\* cited by examiner

*Primary Examiner*—Stephen M. Baker

(57) ABSTRACT

A method and system for interleaving in a parallel turbo decoder enables the use of economical dual-port memory. According to the method, an incoming coding block is divided into a plurality of sub-blocks (step 1005). Each sub-block is divided into a plurality of windows (step 1010). An inter-window shuffle is then performed within each sub-block (step 1015). Each window is divided into two sub-windows (step 1020). Then an intra-window permutation is performed within each sub-window (step 1025).

11 Claims, 6 Drawing Sheets

METHOD AND SYSTEM FOR INTERLEAVING IN A PARALLEL TURBO DECODER

FIELD OF THE INVENTION

The present invention relates generally to error correction coding in high speed communications systems.

BACKGROUND OF THE INVENTION

Wireless data signals are frequently transmitted over hostile radio frequency (RF) interfaces that are susceptible to errors from interference. Thus many types of error correction coding techniques have been created to overcome such interference-induced signal errors. Error correction coding enables the recovery of an original clean signal from a corrupted signal. Turbo codes are advanced wireless error correction coding schemes that are included in many third generation wireless communication standards.

Turbo decoders perform soft-input, soft-output (SISO) operations that exchange information cooperatively to produce accurate estimates of transmitted data that is received over a noisy communication channel. The estimates are defined as probabilities and are interleaved and deinterleaved between SISO operations. Such interleaving scrambles the processing order of received data symbols so as to break up any neighborhoods of corrupted data.

The SISO operations of turbo decoders are executed using iterative decoding algorithms that increase the processing complexity of turbo decoders. To decode an input data stream at the same frequency at which data are arriving, a turbo decoder must process the data at a rate that is faster than the frequency of the arriving data by a factor at least equal to the number of iterations required by the decoder. Thus the speed of a decoder processor is very important to ensure a high quality of service (QoS) to an end user.

To increase processing speed turbo decoders generally divide an incoming block of data into sub-blocks. The sub-blocks are then processed in parallel using multiple sub-decoders. Each sub-decoder implements a Log Maximum-A-Posterior (MAP) algorithm that performs the SISO operations. The output of the Log MAP algorithms are named Log Likelihood Ratios (LLRs) and, concerning digital data, represent the probability that an originally transmitted data bit was either a "0" or a "1".

To perform efficiently, it is critical that the sub-decoders operating in parallel do not interfere with each other, both when reading input data and when storing output data. If the interleavers of a turbo decoder are not designed properly, two sub-decoders may attempt to access the same extrinsic memory bank during a given clock cycle—resulting in what is known as a collision or memory contention. Thus interleavers must be designed so that each sub-decoder will always access a distinct memory bank at any given instant.

BRIEF DESCRIPTION OF THE DRAWINGS

In order that the invention may be readily understood and put into practical effect, reference will now be made to exemplary embodiments as illustrated with reference to the accompanying figures, wherein like reference numbers refer to identical or functionally similar elements throughout the separate views. The figures together with a detailed description below, are incorporated in and form part of the specification, and serve to further illustrate the embodiments and explain various principles and advantages, in accordance with the present invention, where.

Figure 1:
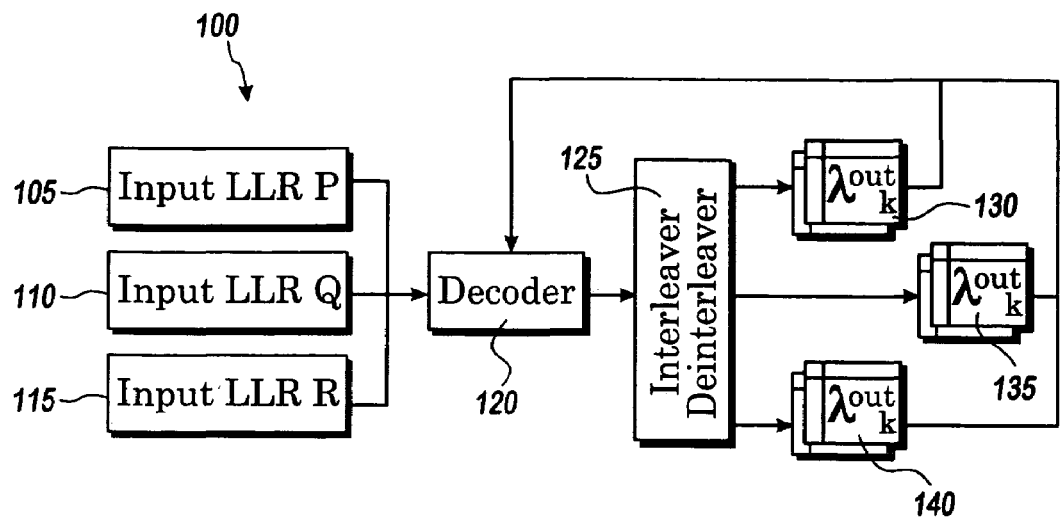
FIG. 1 is a schematic diagram of a MAP decoder system according to an embodiment of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method steps and apparatus components related to a method and system for interleaving in a parallel turbo decoder. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises a . . . " does not, without more constraints, preclude the existence of additional identical elements in the process, method, article, or apparatus that comprises the element.

Referring to FIG. 1 there is a schematic diagram of a MAP decoder system 100 according to an embodiment of the present invention. Each datum from three pipeline phase windows 105, 110, 115 is processed by a decoder 120. An interleaver/deinterleaver 125 interleaves extrinsic information within the three pipeline phase windows 105, 110, 115. Extrinsic information and a priori information 130, 135, 140 corresponding to the phase windows 105, 110, 115, respectively, is output from the interleaver/deinterleaver 125 and routed back to the decoder 120 for a subsequent iteration. Extrinsic information is an output written to a memory buffer; and a priori information is an input read from a memory buffer (which is generally extrinsic information written during a previous iteration). Here, the extrinsic information is the difference between the a-priori information received by the decoder 120 and the a-posteriori LLR information generated by the decoder 120. The iterative process of the system 100 thus generates more reliable soft information about particular received information such as data received over a noisy wireless channel.

Figure 2:
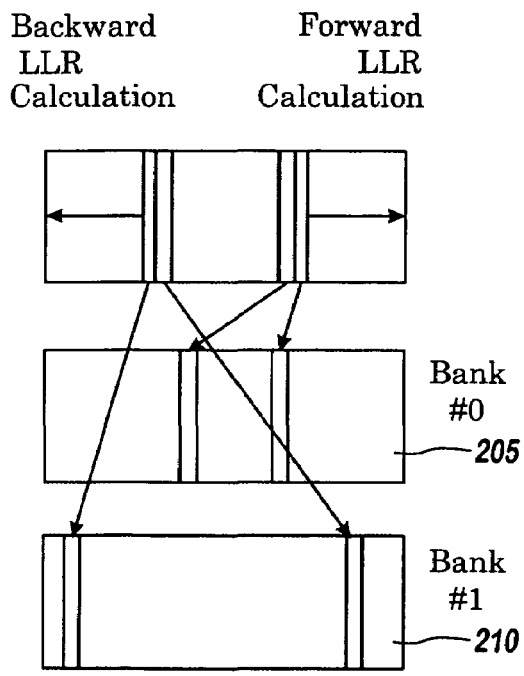
FIG. 2 is a schematic diagram of a memory access process showing four concurrent write memory operations when a decoder performs forward and backward LLR calculations for a given phase window.
Figure 3:
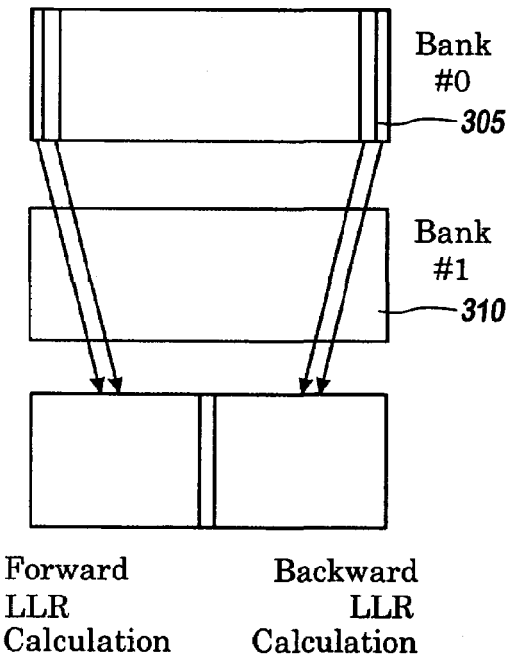
FIG. 3 is a schematic diagram of a memory access process showing four concurrent read memory operations when a decoder performs forward and backward LLR calculations for a given phase window.

Referring to FIGS. 2 and 3 there are schematic diagrams of a memory access process showing four concurrent write/read memory operations when a decoder 120 performs forward and backward LLR calculations for a given phase window 105, 110, 115. Such operations can create memory contentions when multiple processes of the decoder 120 attempt to simultaneously write to a single output memory bank 205, 210 (FIG. 2) or read from a single input memory bank 305, 310 (FIG. 3). To enable contention free access to the memory banks 205, 210, 305, 310 one solution is to use quad-port memory blocks that consist of four data access ports. However, such quad-port memories are complex and expensive. One embodiment of the present invention is a method and system that avoids such memory contentions using more economical dual-port memories.

Figure 4:
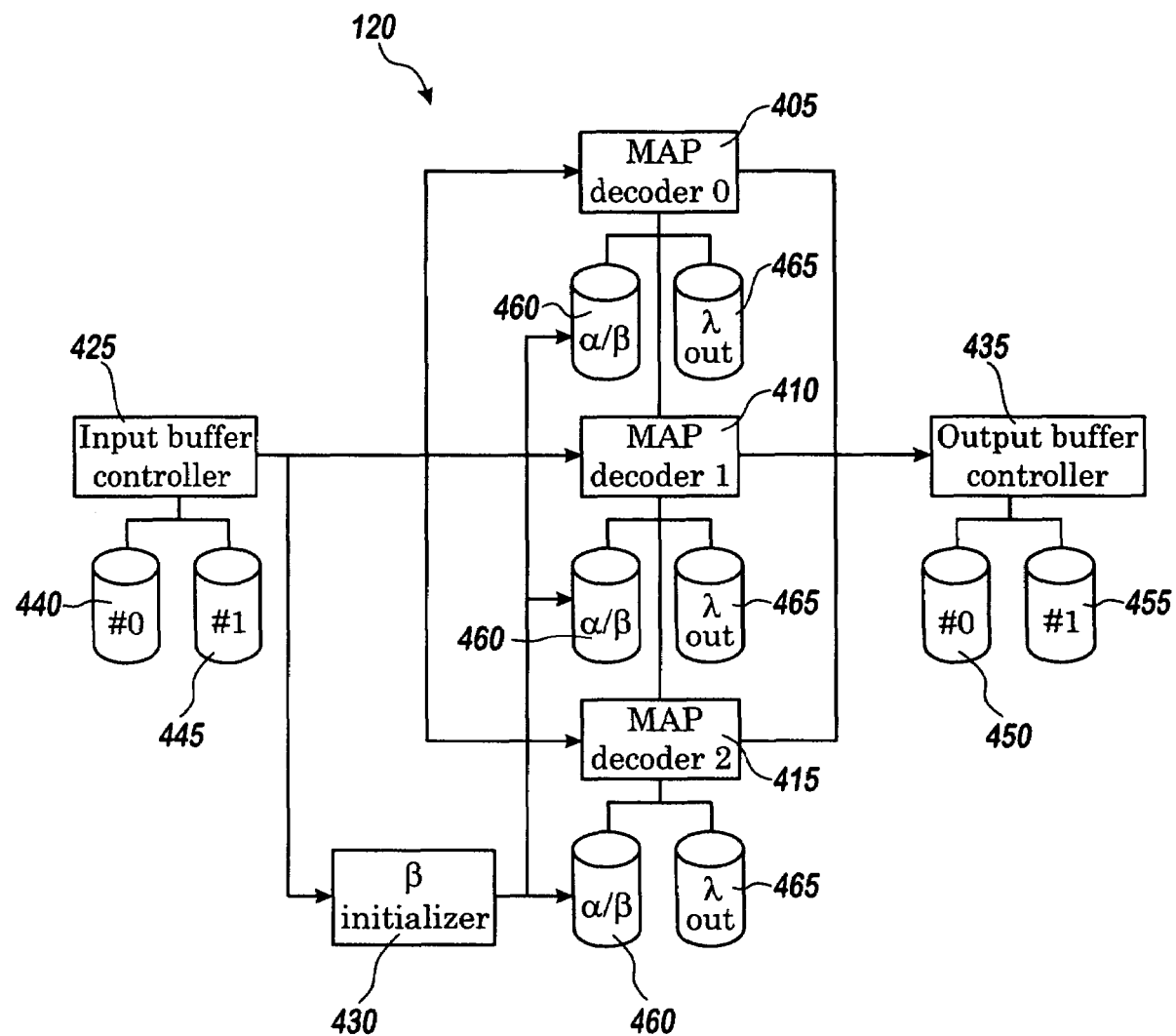
FIG. 4 is a schematic diagram of a parallel turbo decoder having three MAP sub-decoders according to an embodiment of the present invention.

Referring to FIG. 4 there is a schematic diagram of a parallel turbo decoder 120 having three MAP sub-decoders 405, 410, 415 according to an embodiment of the present invention. An input buffer controller 425 controls input buffers 440, 445 and transmits input LLRs to each of the sub-decoders 405, 410, 415. A beta initializer 430 calculates backward path metrics of the tail part. Finally an output buffer controller 435 controls outputs of the parallel turbo decoder 120, which are written to output buffers 450, 455. Both the input buffers 440, 445 and output buffers 450, 455 include "ping-pong" RAM structures that enable an optimal processing speed. Alpha/beta storages 460 are operatively connected to the sub-decoders 405, 410, 415 and store forward and backward path metrics needed for LLR calculations. Lambda out storages 465 are also operatively connected to the sub-decoders 405, 410, 415 and transmit a priori information to each of the sub-decoders 405, 410, 415, and also receive and store extrinsic information from each of them, which is used as a priori information at a next iteration.

Table 1 lists an exemplary number of operations required for different terms in a MAP sub-decoder 405, 410, 415 of both a radix-2 and a radix-4 decoder 120 in case of using MAX-Log-MAP algorithm, which is one of simplified MAP algorithm for complexity reduction. As a measure of complexity Table 1 thus shows the number of "+" (adder), "−" (subtractor), and "MAX" (2 to 1 selector) operations in parallel windowing MAP decoders 120 of the radix-2 and radix-4 type. Assuming that a zero/one method for a radix-2 or a one-half method for a radix-4 are used, and operations in tail bit processes are excluded, a preliminary design of a radix-4 turbo decoder 120 requires about 2.3 times as many operators per unit throughput as a radix-2 decoder. Because a radix-4 decoder 120 requires such a large number of operations, a pipeline design is generally required to enable a high operating frequency.

TABLE 1

Number of Operations in MAX-Log-MAP Sub-Decoder

| Radix | Term | "+" "−" | "MAX" | Subtotal | Total/unit throughput |
|---|---|---|---|---|---|
| 2 | $\gamma$ | 12 * 2 = 24 | 0 | 24 | |
|   | $\alpha$ | 14 | 8 | 22 | 160/1 = 160 |
|   | $\beta$ | 14 | 8 | 22 | |
|   | $\lambda$ | 32 * 2 = 64 | 14 * 2 = 28 | 92 | |
|   | Subtotal | 116 | 44 | 160 | |
| 4 | $\gamma$ | 24 * 2 = 48 | 0 | 48 | |
|   | $\alpha$ | 64 | 24 | 88 | 736/2 = 368 |
|   | $\beta$ | 64 | 24 | 88 | |
|   | $\lambda$ | 196 * 2 = 392 | 60 * 2 = 120 | 512 | |
|   | Subtotal | 568 | 168 | 736 | |

Figure 5:
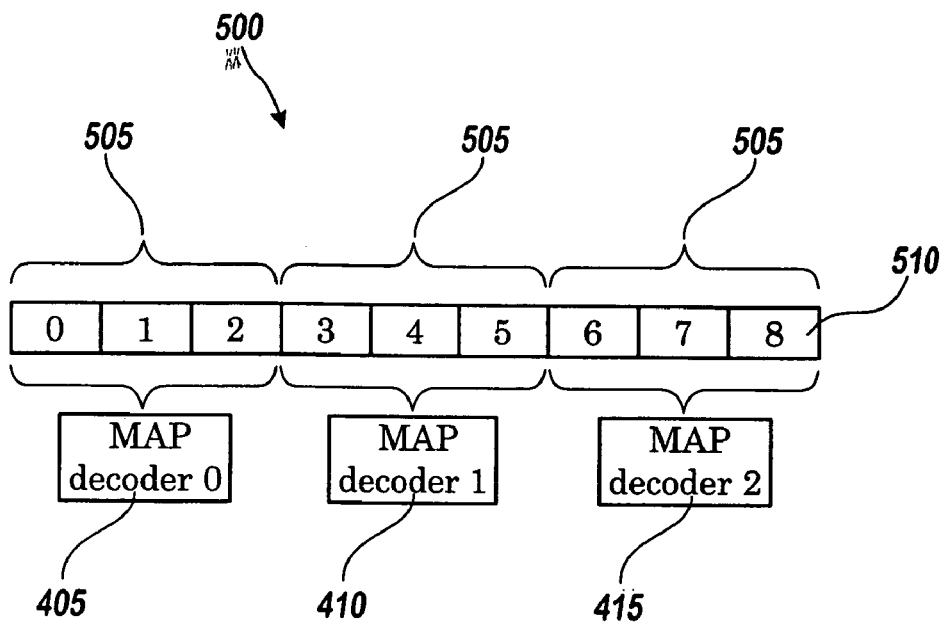
FIG. 5 is an illustration of an incoming coding block that is divided, according to an embodiment of the present invention, into a plurality of sub-blocks.

Accordingly, referring to FIG. 5 there is an illustration of an incoming coding block 500 that is divided, according to an embodiment of the present invention using a radix-4 decoder, into a plurality of sub-blocks 505. Each sub-block 505 is further divided into a plurality of windows 510. Each sub-block 505 is processed by one of the sub-decoders 405, 410, 415. Those skilled in the art will appreciate that any number of sub-decoders 405, 410, 415 can be used according to different embodiments of the present invention, limited only by the performance of the associated hardware resources. For example, one design of a radix-4 turbo decoder that exploits the advantages of the present invention includes a number of active sub-decoders 405, 410, 415 that varies between one and five; thus where there are five sub-decoders an incoming coding block is divided into five sub-blocks 505 and 15 windows 510.

According to an embodiment of the present invention using three sub-decoders 405, 410, 415, an incoming coding block 500 is divided into three sub-blocks 505. Each sub-block 505 is then divided into three windows 510. An interleaver/deinterleaver 125 assists in performing an inter-window shuffle within each sub-block 505. Thus during processing each sub-decoder 405, 410, 415 exchanges extrinsic information within only its three associated windows 510.

Figure 6:
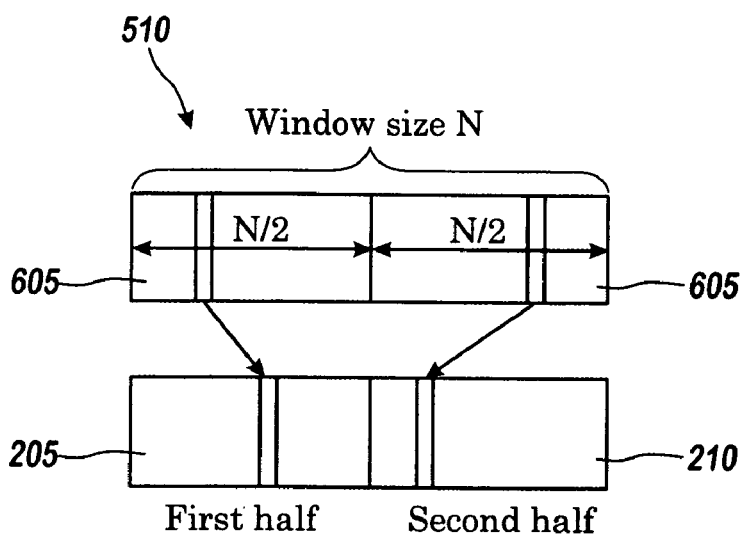
FIG. 6 is an illustration of an individual window of a coding sub-block according to an embodiment of the present invention.

Referring to FIG. 6 there is an illustration of an individual window 510 of a coding sub-block 505. According to an embodiment of the present invention, each window 510 is divided into two sub-windows 605. An intra-window permutation is then performed within each sub-window 605.

Those skilled in the art will appreciate that the interleaver/deinterleaver 125 can be implemented with a table look up scheme, enabling an arbitrary interleaving pattern such as a 3 GPP compliant interleaver/deinterleaver 125 to be used for an intra-sub-window permutation.

Parallelization is thus very effective at improving the throughput of a turbo decoder 120. Parallel windowing is a technique that divides a data frame into windows and decodes received bits at each window. An excessive number of parallel windows however can cause degradation of an interleaver gain due to the resulting small window sizes.

Figure 7:
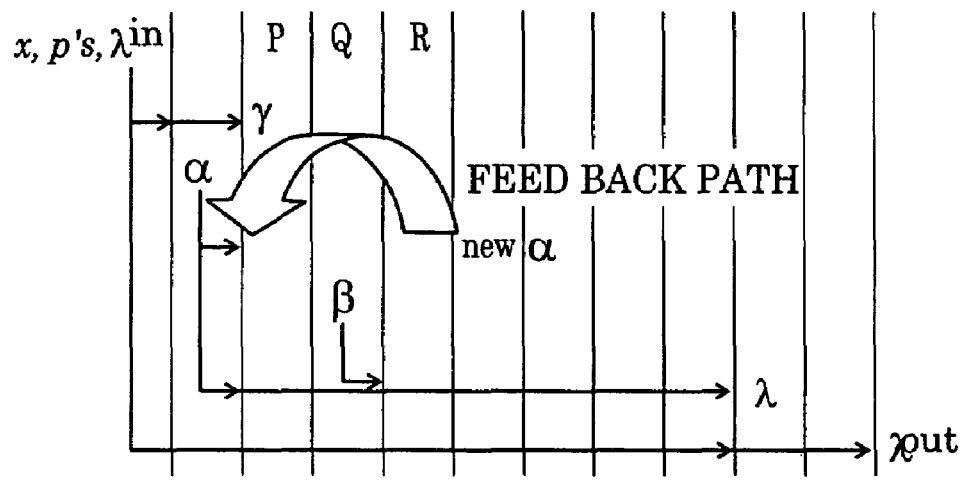
FIG. 7 is a sequence chart illustrating the pipeline flow through a sub-decoder according to an embodiment of the present invention.

Referring to FIG. 7 there is a sequence chart illustrating the pipeline flow through a sub-decoder 405, 410, 415 according to an embodiment of the present invention. Here x represents a systematic bit, p's represent parity bits, $\lambda^{in}$ represents a priori information (i.e., extrinsic information from a previous iteration), and γ represents a branch metric. The vertical lines represent boundaries of single clock cycles and P, Q, and R represent the processing of the three pipeline phase windows 105, 110, 115. Thus if α is the last updated α at time k, then new α is the updated α at time k+2. β is equal to β at time k+1 and λ is the LLR at time k/(k+1). To ensure that the pipeline always remains full, the three windows 105, 110, 115 are processed in rotation.

Figure 9:
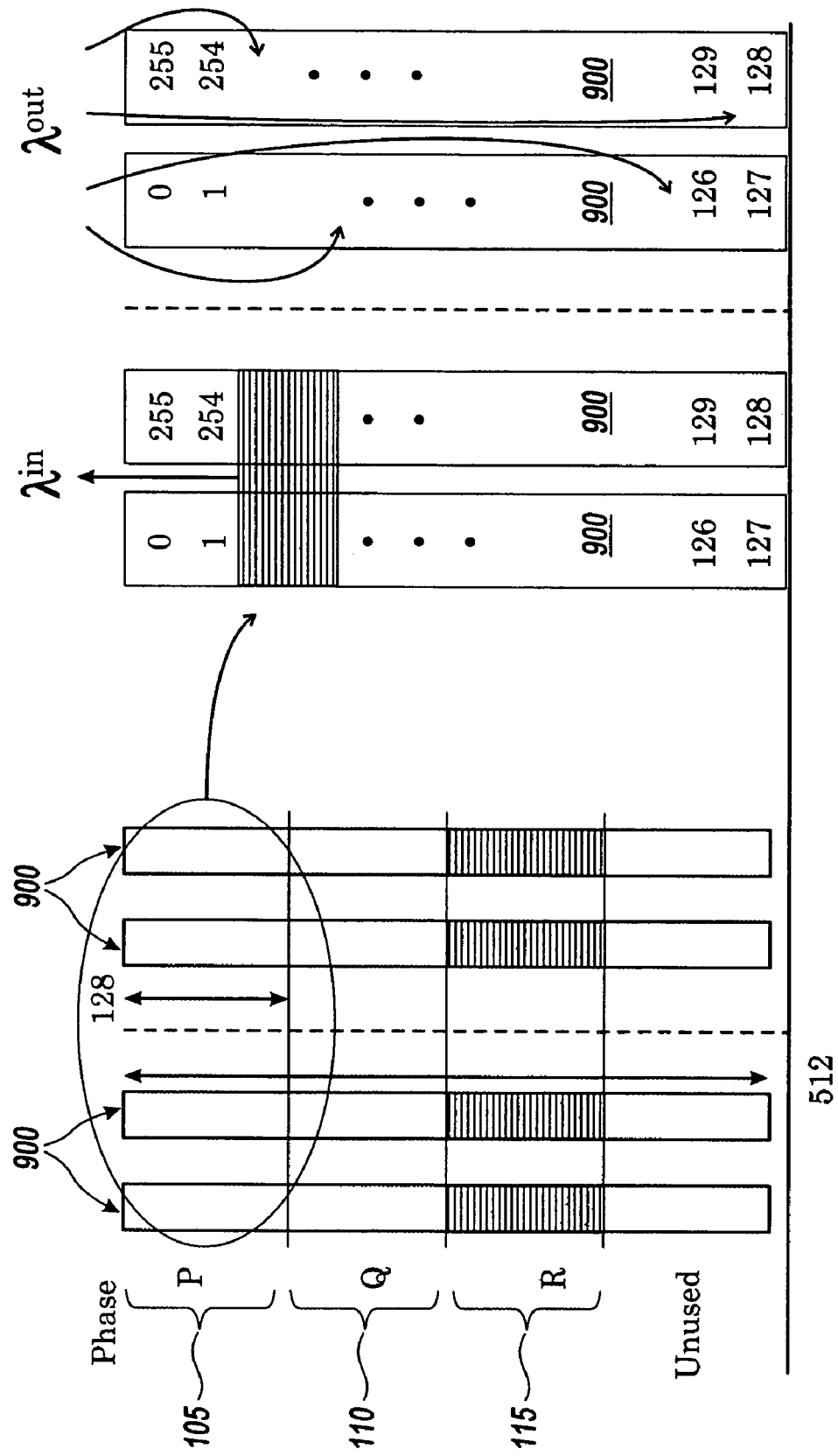
FIG. 9 is a schematic diagram illustrating the advantages of an intra-window permutation process according to an embodiment of the present invention.

Table 2 below provides a further illustration of pipeline flow according to an embodiment of the present invention. For example, referring to Table 2, at clock cycle 4 a new alpha P1 is fed back as an old alpha for a next update. The input LLRs (x, p's) and a priori information are continuously processed to ensure that the pipeline remains full.

memory block 900 corresponds to a memory bank 205 or 210 as discussed above, and each pair of memory blocks 900 shown in FIG. 9 corresponds to a lambda out storage 465 as discussed above.

Figure 10:
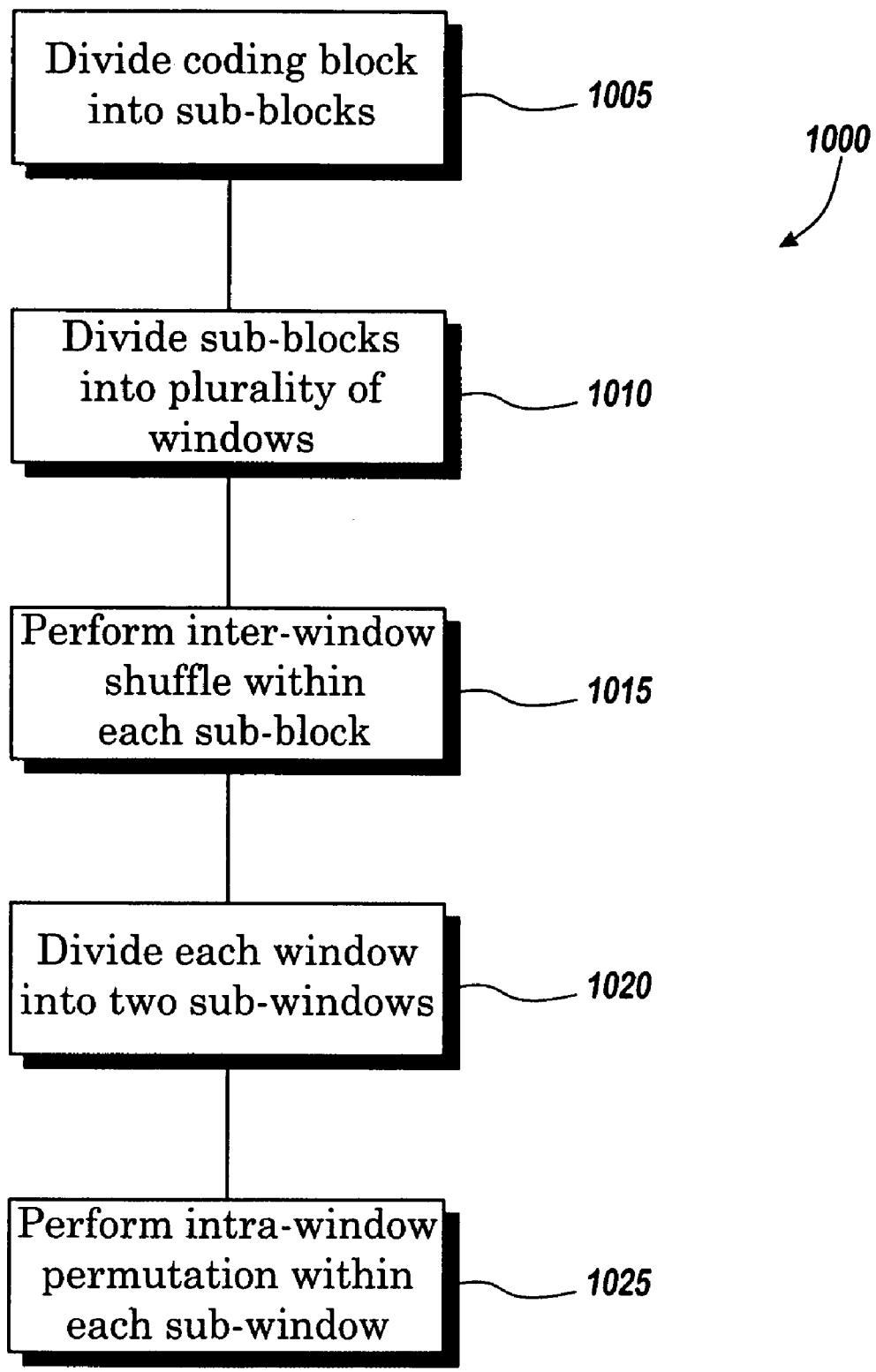
FIG. 10 is a generalized flow diagram illustrating the steps of a method for interleaving in a parallel turbo decoder according to an embodiment of the present invention.

In summary, referring to FIG. 10 there is a generalized flow diagram illustrating the steps of a method 1000 for interleaving in a parallel turbo decoder according to an embodiment of the present invention. First, at step 1005 an incoming coding block 500 is divided, into a plurality of sub-blocks 505. At step 1010 each sub-block 505 is divided into a plurality of windows 510. Next, at step 1015 an inter-window shuffle is performed within each sub-block 505. At step 1020 each window 510 is divided into two sub-windows 605. Then at step 1025 an intra-window permutation is performed within each sub-window 605.

TABLE 2

Pipeline Flow

| | Clock cycle | | | | | | | | | |
|---|---|---|---|---|---|---|---|---|---|---|
| | 0 | 1 | 2 | 3 | 4 | 5 | 6 | 7 | 8 | 9 |
| input LLR/a priori info from window | P1 105 | Q1 110 | R1 115 | P2 105 | Q2 110 | R2 115 | P3 105 | Q3 110 | R3 115 | P4 105 |
| gamma | — | P1 | Q1 | R1 | P2 | Q2 | R2 | P3 | Q3 | R3 |
| old alpha (feedback) | — | P0 | Q0 | R0 | P1 | Q1 | R1 | P2 | Q2 | R2 |
| (pipeline 1) | — | — | P1 | Q1 | R1 | P2 | Q2 | R2 | P3 | Q3 |
| (pipeline 2) | — | — | — | P1 | Q1 | P1 | P2 | Q2 | R2 | P3 |
| new alpha (pipeline 3) | — | — | — | — | P1 | Q1 | R1 | P2 | Q2 | R2 |

Figure 8:
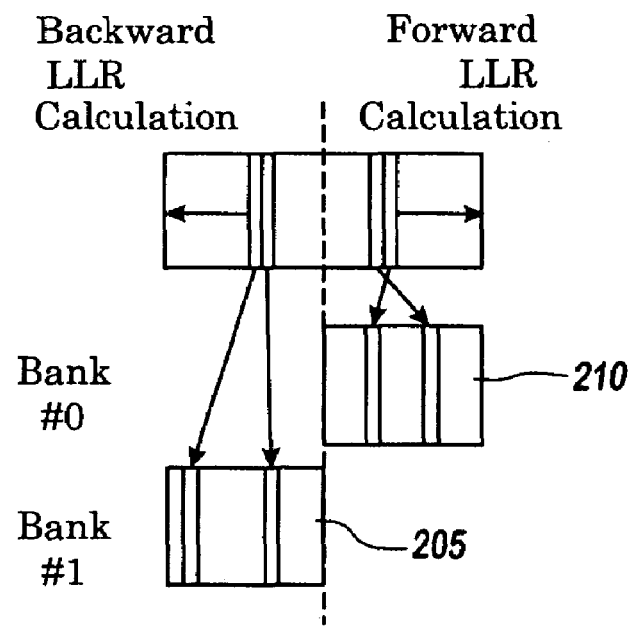
FIG. 8 is a schematic diagram of a memory access process showing forward and backward LLR calculations for a given phase window according to an embodiment of the present invention.

Referring to FIG. 8 there is a schematic diagram of a memory access process showing forward and backward LLR calculations for a given phase window 105, 110, 115 according to an embodiment of the present invention. The intra-window permutation described above thus enables contention free access to memory banks 205, 210, each of which is a dual-port memory, acting as extrinsic information buffers.

Referring to FIG. 9 there is a schematic diagram illustrating the advantages of an intra-window permutation process according to an embodiment of the present invention. Each vertical rectangle represents a dual port memory block 900 that is shared between phase windows P 105, Q 110, and R 115. The right side of FIG. 9 shows how the four memory blocks 900 assigned to phase window P 105 are merged according to memory block size and according to whether data is being read from or written to each block 900. The embodiment shown here includes a window size of 256 locations and thus each sub-window has 128 locations. Therefore data from three windows 510 can be stored in a memory block 900 having 512 locations, with 128 locations unused.

The right side of FIG. 9 further illustrates how a sub-decoder 405 reads four a priori information symbols ($\lambda^{in}$) from the left two memory blocks 900 and concurrently writes four extrinsic information symbols ($\lambda^{out}$) to the right two memory blocks 900. The a priori information is read using straight addressing, meaning that an address counter simply counts up by two. The extrinsic information is written using interleaving/deinterleaving addressing, meaning that each address is independent and is not simply counted up or down. Alternatives according to other embodiments of the present invention include a priori information read by interleaving addressing and extrinsic information written by straight addressing. Those skilled in the art will recognize that each Those skilled in the art will appreciate that the number of windows 510 used according to the present invention are generally equal to the number of pipeline stages used in a particular turbo decoder. Thus if an α/β update process requires three clock cycles, then an incoming coding block 500 will be divided into three sub-blocks 505. The number of pipeline stages used in a particular decoder will depend, for example, on features of specific silicon technology or on circuit layout specifics provided to a decoder designer.

Advantages of the present invention thus include the ability to use economical dual-port memory in an efficient parallel turbo decoder 120. A number of windows 510 are linked to a number of pipeline stages and the windows 510 are divided in two. Economical high speed data communications are thus enabled between various types of devices such as mobile phones, personal digital assistants (PDAs), and notebook computers.

It will be appreciated that embodiments of the invention described herein may be comprised of one or more conventional processors and unique stored program instructions that control the one or more processors to implement, in conjunction with certain non-processor circuits, some, most, or all of the functions of interleaving in a parallel turbo decoder as described herein. The non-processor circuits may include, but are not limited to, a radio receiver, a radio transmitter, signal drivers, clock circuits, power source circuits, and user input devices. As such, these functions may be interpreted as steps of a method for interleaving in a parallel turbo decoder. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention. The benefits, advantages, solutions to problems, and any elements that may cause any benefit, advantage, or solution to occur or become more pronounced are not to be construed as critical, required, or essential features or elements of any or all of the claims. The invention is defined solely by the appended claims including any amendments made during the pendency of this application and all equivalents of those claims.

I claim:

1. A method of interleaving in a parallel turbo decoder comprising:
    dividing an incoming coding block into a plurality of sub-blocks;
    dividing each sub-block into a plurality of windows;
    performing an inter-window shuffle within each sub-block;
    dividing each window into two sub-windows; and
    performing an intra-window permutation within each sub-window.

2. The method of claim 1 wherein the incoming coding block is divided into three sub-blocks, where each sub-block corresponds to a MAP sub-decoder in the turbo decoder.

3. The method of claim 1 wherein the parallel turbo decoder is implemented in an ASIC or an FPGA device.

4. The method of claim 1 wherein the intra-window permutation within each sub-window is performed within two ports of a dual-port memory.

5. The method of claim 1 wherein the incoming coding block is divided into a variable number of sub-blocks corresponding to a variable number of sub-decoders used in the turbo decoder.

6. A system for interleaving in a parallel turbo decoder, comprising:
    a decoder comprising a plurality of sub-decoders;
    an interleaver/deinterleaver operatively connected to the decoder; and
    a plurality of memory banks operatively connected to both the decoder and the interleaver/deinterleaver;
    wherein an incoming coding block is divided by the decoder into a plurality of sub-blocks and each sub-block is divided into a plurality of windows, and the decoder, interleaver/deinterleaver and memory banks operatively perform an inter-window shuffle within each sub-block, divide each window into two sub-windows, and perform an intra-window permutation within each sub-window.

7. The system of claim 6 wherein the incoming coding block is divided into three sub-blocks, where each sub-block corresponds to a MAP sub-decoder in the turbo decoder.

8. The system of claim 6 wherein the parallel turbo decoder is implemented in an ASIC or an FPGA device.

9. The system of claim 6 wherein the intra-window permutation within each sub-window is performed within two ports of a dual-port memory.

10. The system of claim 6 wherein the incoming coding block is divided into a variable number of sub-blocks corresponding to a variable number of sub-decoders used in the turbo decoder.

11. A system for interleaving in a parallel turbo decoder comprising:
    means for dividing an incoming coding block into a plurality of sub-blocks;
    means for dividing each sub-block into a plurality of windows;
    means for performing an inter-window shuffle within each sub-block;
    means for dividing each window into two sub-windows; and
    means for performing an intra-window permutation within each sub-window.

* * * * *